United States Patent
Seo et al.

(10) Patent No.: US 12,514,085 B2
(45) Date of Patent: Dec. 30, 2025

(54) DISPLAY DEVICE HAVING REDUCED RESISTANCE BETWEEN CONTACT ELECTRODE FOR SUPPLYING LOW-POTENTIAL POWER VOLTAGE AND CATHODE

(71) Applicant: LG Display Co., Ltd., Seoul (KR)

(72) Inventors: Bumsik Seo, Paju-si (KR); Gunwoo Lee, Gangneung-si (KR); Sumin Jung, Paju-si (KR); Yonghoon Jo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 507 days.

(21) Appl. No.: 17/978,648

(22) Filed: Nov. 1, 2022

(65) Prior Publication Data

US 2023/0189599 A1    Jun. 15, 2023

(30) Foreign Application Priority Data

Dec. 13, 2021    (KR) .................. 10-2021-0177723

(51) Int. Cl.
  *H10K 59/131*  (2023.01)
(52) U.S. Cl.
  CPC ............................. *H10K 59/1315* (2023.02)
(58) Field of Classification Search
  CPC ................................................ H10K 59/1315
  USPC .......................................................... 257/91
  See application file for complete search history.

(56) References Cited

U.S. PATENT DOCUMENTS

2016/0233285 A1\* 8/2016 Lee ................. H10K 59/80522
2019/0305003 A1   10/2019 Tan et al.
2021/0351371 A1\* 11/2021 Wang ................. H10K 59/1315

FOREIGN PATENT DOCUMENTS

| CN | 104766930 A | 7/2015 |
|---|---|---|
| CN | 108461530 A | 8/2018 |
| KR | 10-2015-0030088 A | 3/2015 |
| KR | 2017-0127622 A | 11/2017 |
| KR | 2018-0036434 A | 4/2018 |

\* cited by examiner

*Primary Examiner* — Xia L Cross
(74) *Attorney, Agent, or Firm* — Seed Intellectual Property Law Group LLP

(57) ABSTRACT

According to an aspect of the present disclosure, the display device includes: a substrate including a display area and a non-display area adjacent to the display area, a plurality of light emitting diodes disposed in the display area and each including a cathode, a contact electrode disposed in the non-display area, and a plurality of insulating layers disposed on the substrate. At least one of the plurality of insulating layers includes a plurality of protrusions disposed between the substrate and the contact electrode, and the contact electrode is composed of a convex portion overlapping with the plurality of protrusions and a concave portion between the plurality of protrusions. Therefore, according to the present disclosure, the surface area of the contact electrode is increased due to the plurality of protrusions so that a resistance between the contact electrode and the cathode can be reduced.

10 Claims, 8 Drawing Sheets

DISPLAY DEVICE HAVING REDUCED RESISTANCE BETWEEN CONTACT ELECTRODE FOR SUPPLYING LOW-POTENTIAL POWER VOLTAGE AND CATHODE

CROSS-REFERENCE TO RELATED APPLICATIONS

This application claims the priority of Korean Patent Application No. 10-2021-0177723 filed on Dec. 13, 2021, in the Korean Intellectual Property Office, the disclosure of which is incorporated herein by reference.

BACKGROUND

Technical Field

The present disclosure relates to a display device, and more particularly, to a display device in which resistance between a contact electrode for supplying a low-potential power voltage and a cathode is reduced.

Description of the Related Art

Display devices used for a computer monitor, a TV, a mobile phone, etc., include an organic light emitting display (OLED) that emits light by itself, a liquid crystal display (LCD) that requires a separate light source, etc.

As the display devices have been increasingly applied to diverse fields such as a computer monitor, a TV and a personal mobile device, display devices having a large display area and a reduced volume and weight have been studied.

In addition, in recent years, a display element, a line and the like are formed on a flexible substrate made of a flexible material such as plastic. Therefore, a flexible display device can be manufactured to display an image even when being bent or rolled like paper and thus has attracted a lot of attention as a next-generation display device.

BRIEF SUMMARY

One or more embodiments of the present disclosure is to provide a display device in which resistance between a cathode and a contact electrode for supplying a low-potential power voltage to the cathode is reduced.

One or more embodiments of the present disclosure provide a display device in which a contact area between a contact electrode and a cathode is increased.

One or more embodiments of the present disclosure provide a display device in which a current density between a contact electrode and a cathode is lowered and heat generation is reduced.

One or more embodiments of the present disclosure provide a display device in which a contact area between a contact electrode and a cathode is increased without an increase in bezel area.

Technical benefits of the present disclosure are not limited to the above-mentioned benefits, and other benefits, which are not mentioned above, can be clearly understood by those skilled in the art from the following descriptions.

According to an aspect of the present disclosure, the display device includes: a substrate including a display area and a non-display area adjacent to the display area. Also, the display device includes a plurality of light emitting diodes disposed in the display area and each including a cathode. Further, the display device includes a contact electrode disposed in the non-display area and supplying a low-potential power voltage to the cathode. Furthermore, the display device includes a plurality of insulating layers disposed on the substrate. At least one of the plurality of insulating layers includes a plurality of protrusions disposed between the substrate and the contact electrode so as to overlap with the contact electrode. The contact electrode is composed of a convex portion overlapping with the plurality of protrusions and a concave portion between the plurality of protrusions. Therefore, according to the present disclosure, the surface area of the contact electrode is increased due to the plurality of protrusions. Thus, it is possible to reduce resistance between the contact electrode and the cathode and reduce (or minimize) heat generation from the contact electrode.

Other detailed matters of the embodiments are included in the detailed description and the drawings.

According to the present disclosure, it is possible to increase a contact area between a contact electrode and a cathode and thus lower a current density and reduce resistance.

According to the present disclosure, it is possible to increase a contact area between a contact electrode and a cathode and thus reduce heat generation and improve the reliability of a display device.

According to the present disclosure, it is possible to increase a contact area between a contact electrode and a cathode without an increase in bezel area.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
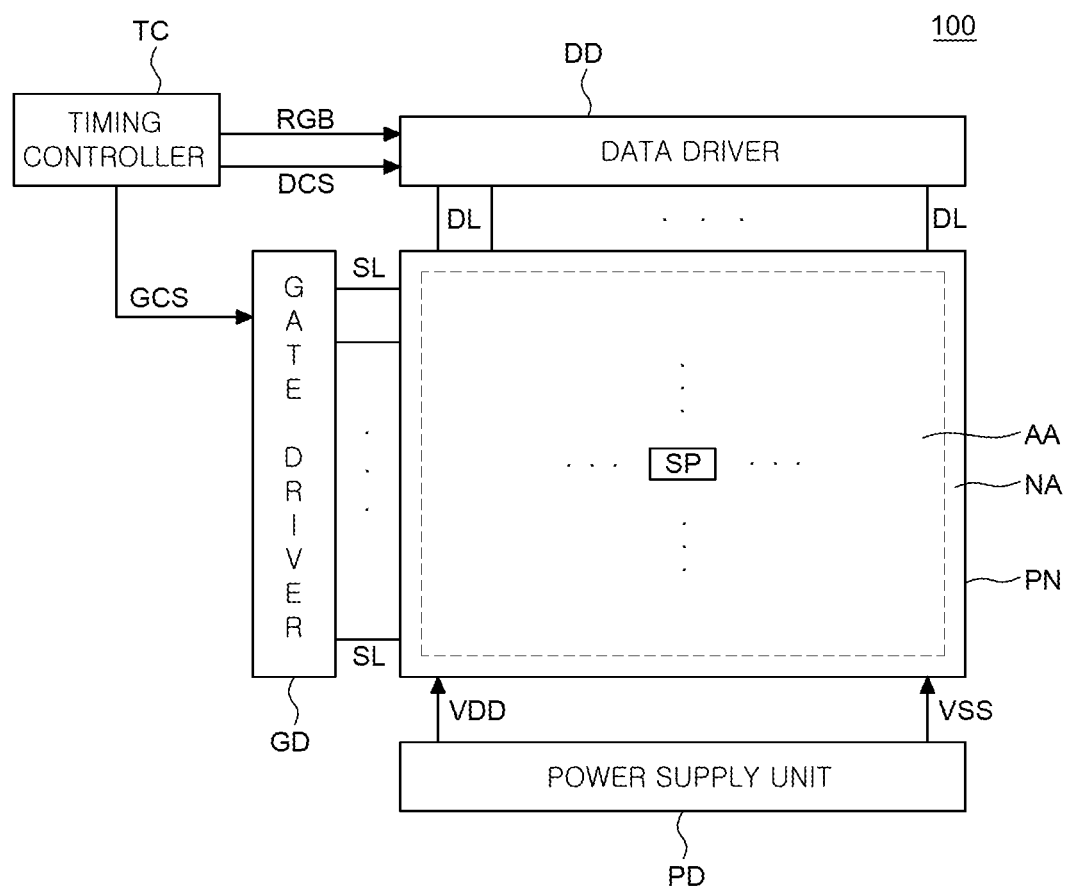
FIG. 1 is a schematic configuration diagram of a display device according to an embodiment of the present disclosure.

Advantages and characteristics of the present disclosure and a method of achieving the advantages and characteristics will be clear by referring to embodiments described below in detail together with the accompanying drawings.

However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated. When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to embodiments of the present disclosure will be described in detail with reference to accompanying drawings.

FIG. 1 is a schematic configuration diagram of a display device according to an embodiment of the present disclosure. In FIG. 1, for the convenience of description, only a display panel PN, a gate driver GD, a data driver DD, a power supply unit PD, and a timing controller TC among various components of a display device 100 are illustrated.

Referring to FIG. 1, the display device 100 includes the display panel PN including a plurality of sub-pixels SP, and the gate driver GD and the data driver DD for supplying various signals to the display panel PN. Also, the display device 100 includes the timing controller TC for controlling the gate driver GD and the data driver DD and the power supply unit PD for supplying various powers.

The gate driver GD supplies a scan signal to a plurality of scan lines SL in response to a plurality of gate control signals GCS supplied from the timing controller TC. FIG. 1 illustrates that a single gate driver GD is disposed to be spaced apart from one side of the display panel PN, but the number and placement of gate drivers GD are not limited thereto.

The data driver DD converts image data RGB input from the timing controller TC into a data voltage using a gamma voltage in response to a plurality of data control signals DCS supplied from the timing controller TC. The data driver DD may select a gamma voltage corresponding to a grayscale of the image data RGB from among gamma voltages and generate a data voltage. Then, the data driver DD may supply the generated data voltage to a plurality of data lines DL.

The power supply unit PD may generate a power to be applied to the data driver DD or the display panel PN. The power supply unit PD may supply a power for driving the data driver DD. The power supply unit PD may supply a high-potential power voltage VDD and a low-potential power voltage VSS for driving the display panel PN.

The timing controller TC aligns the image data RGB input from the outside and supplies the aligned image data RGB to the data driver DD. The timing controller TC may generate a gate control signal GCS and a data control signal DCS using a synchronization signal, for example, a dot clock signal, a data enable signal, and a horizontal/vertical synchronization signal, input from the outside. Further, the timing controller TC may supply the generated gate control signal GCS and data control signal DCS to the gate driver GD and the data driver DD, respectively, to control the gate driver GD and the data driver DD.

The display panel PN is configured to display an image to a user, and includes a plurality of sub-pixels SP. In the display panel PN, a plurality of scan lines SL and a plurality of data lines DL overlap with each other, and each of the plurality of sub-pixels SP is connected to the scan line SL and the data line DL. Also, each of the plurality of sub-pixels SP may be supplied with the high-potential power voltage VDD, the low-potential power voltage VSS, or the like.

The display panel PN includes a display area AA and a non-display area NA.

The display area AA is an area where an image is displayed. In the display area AA, a plurality of sub-pixels SP for displaying an image and a circuit unit for driving the plurality of sub-pixels SP are disposed. The circuit unit may include various transistors, capacitors and lines for driving the plurality of sub-pixels SP. For example, the circuit unit may include various components such as a driving thin film transistor, a switching thin film transistor, a storage capacitor, a scan line SL and a data line DL, but is not limited thereto.

The plurality of sub-pixels SP is a minimum unit for forming an image, and several sub-pixels SP may form a single pixel. Each of the plurality of sub-pixels SP includes a light emitting diode and a pixel circuit for driving the light emitting diode. A plurality of light emitting diodes may be defined in different ways depending on the type of the display panel PN. For example, when the display panel PN is an organic light emitting display panel, the light emitting diode may be an organic light emitting diode including an anode, an emission layer and a cathode. Alternatively, a quantum dot light emitting diode (QLED) including a light emitting diode (LED) or a quantum dot (QD) may be used as a light emitting diode.

The non-display area NA is an area where an image is not displayed. In the non-display area NA, various lines and driver ICs for driving the plurality of sub-pixels SP disposed in the display area AA may be disposed. For example, the gate driver GD or the like may be disposed in the non-display area NA.

Meanwhile, in FIG. 1, the non-display area NA is defined as an area surrounding the display area AA. However, the non-display area NA may be defined as an area extending from one side of the display area AA, but is not limited thereto.

Meanwhile, in the non-display area NA, a contact electrode for supplying the low-potential power voltage VSS to a cathode of a light emitting diode is disposed. The contact electrode is disposed in the non-display area NA and may supply the low-potential power voltage VSS from the power supply unit PD to the cathode. The contact electrode will be described later with reference to FIG. 3 and FIG. 4.

Hereinafter, the plurality of sub-pixels SP will be described in more detail with reference to FIG. 2 together.

Figure 2:
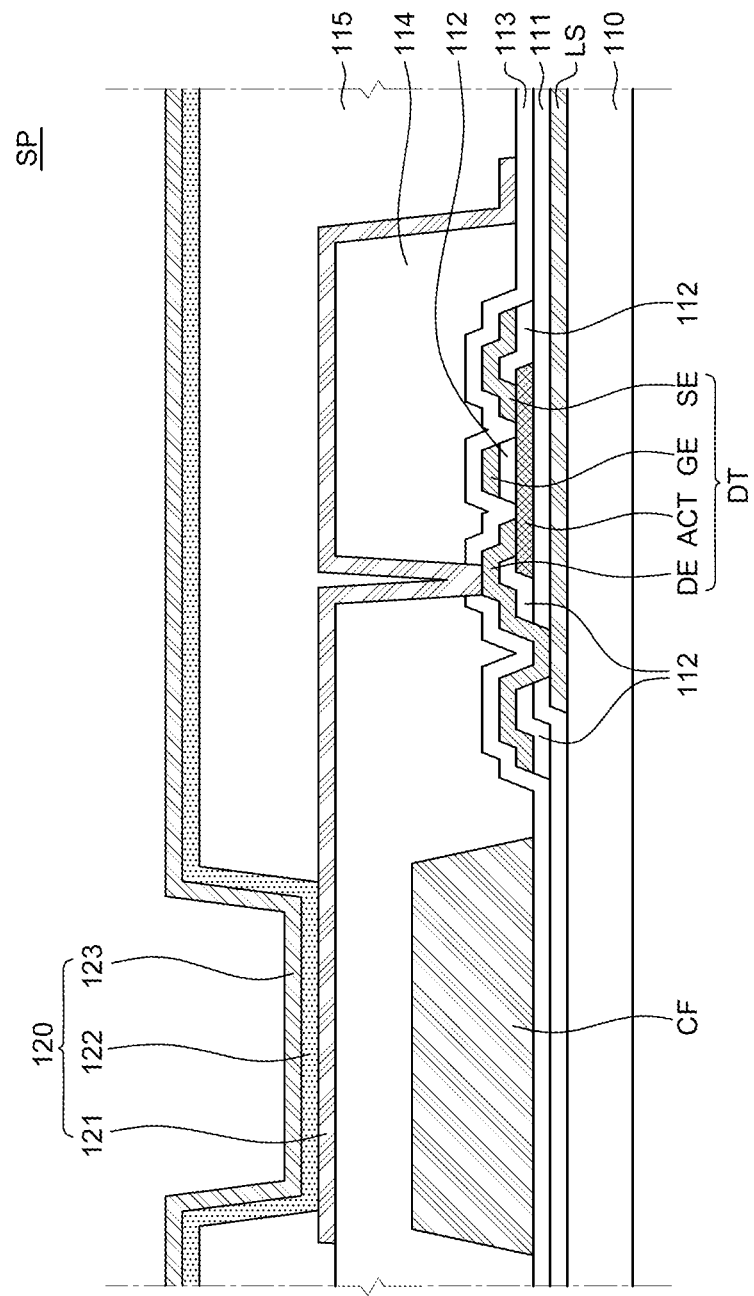
FIG. 2 is a cross-sectional view illustrating a sub-pixel of the display device according to an embodiment of the present disclosure.

FIG. 2 is a cross-sectional view illustrating a sub-pixel of the display device according to an embodiment of the present disclosure. Referring to FIG. 2, the display device 100 according to an embodiment of the present disclosure includes a substrate 110, a buffer layer 111 and a gate insulating layer 112. Also, the display device 100 includes a passivation layer 113, a planarization layer 114, a bank 115, a light shielding layer LS, a driving transistor DT, a color filter CF and a light emitting diode 120.

The light shielding layer LS is disposed on the substrate 110. The light shielding layer LS may block light incident to an active layer ACT of the driving transistor DT from below the substrate 110 and thus reduce or minimize a leakage current. For example, the light shielding layer LS may be disposed under the driving transistor DT to block light incident to the active layer ACT. Meanwhile, when light is irradiated to the active layer ACT, a leakage current occurs. Therefore, the reliability of the driving transistor DT may decrease. Therefore, since the light shielding layer LS that may block light is disposed to overlap with the driving transistor DT, it is possible to improve the reliability of the driving transistor DT. The light shielding layer LS may be made of an opaque conductive material such as copper (Cu), aluminum (Al), molybdenum (Mo), nickel (Ni), titanium (Ti), chromium (Cr) or an alloy thereof, but is not limited thereto.

The buffer layer 111 is disposed on the substrate 110 and the light shielding layer LS. The buffer layer 111 may suppress spread of moisture and/or oxygen which permeates from the outside of the substrate 110. The buffer layer 111 may be made of an inorganic material. For example, the buffer layer 111 may be formed as a single layer or a multilayer of silicon oxide (SiOx) or silicon nitride (SiNx), but is not limited thereto.

The driving transistor DT is disposed on the buffer layer 111. The driving transistor DT may be disposed in each of the plurality of sub-pixels SP of the display area AA. The driving transistor DT disposed in each of the plurality of sub-pixels SP may be used as a driving element of the display device 100. The driving transistor DT may be, for example, a thin film transistor (TFT), an N-channel metal oxide semiconductor (NMOS) transistor, a P-channel metal oxide semiconductor (PMOS) transistor, a complementary metal oxide semiconductor (CMOS) transistor, a field effect transistor (FET) or the like, but is not limited thereto. Hereinafter, a plurality of driving transistors DT is assumed as thin film transistors, but is not limited thereto.

The driving transistor DT includes a gate electrode GE, the active layer ACT, a source electrode SE and a drain electrode DE.

The active layer ACT of the driving transistor DT is disposed on the buffer layer 111. For example, the active layer ACT may be made of an oxide semiconductor, amorphous silicon or polysilicon, but is not limited thereto.

The gate electrode GE is disposed on the active layer ACT. The gate electrode GE may be made of a conductive material such as copper (Cu), aluminum (Al), molybdenum (Mo), titanium (Ti) or an alloy thereof, but is not limited thereto.

A gate insulating layer 112 is disposed between the gate electrode GE and the active layer ACT. The gate insulating layer 112 is configured to insulate the gate electrode GE from the active layer ACT. The gate insulating layer 112 may be made of an inorganic material. For example, the gate insulating layer 112 may be formed as a single layer or a multilayer of silicon oxide (SiOx) or silicon nitride (SiNx), but is not limited thereto.

The source electrode SE and the drain electrode DE are disposed on the active layer ACT and are spaced apart from each other. The source electrode SE and the drain electrode DE may be electrically connected to the active layer ACT through contact holes formed in the gate insulating layer 112. The source electrode SE and the drain electrode DE may be made of a conductive material such as copper (Cu), aluminum (Al), molybdenum (Mo), titanium (Ti) or an alloy thereof, but are not limited thereto.

In this case, the drain electrode DE may be electrically connected to the light shielding layer LS through a contact hole formed in the buffer layer 111. The light shielding layer LS may not float and may have the same potential as the drain electrode DE and thus may not affect driving of the driving transistor DT. However, the light shielding layer LS may also be connected to other components, but is not limited thereto.

The passivation layer 113 is disposed on the driving transistor DT. The passivation layer 113 is an insulating layer for protecting the components under the passivation layer 113. The passivation layer 113 may be made of an inorganic material. For example, the passivation layer 113 may be formed as a single layer or a multilayer of silicon oxide (SiOx) or silicon nitride (SiNx), but is not limited thereto. Also, the passivation layer 113 may be omitted depending on the design.

The color filter CF is disposed on the passivation layer 113. The color filter CF may convert light emitted from the light emitting diode 120 into light of various colors. The color filter CF is disposed to overlap with the light emitting diode 120 in each of the plurality of sub-pixels SP. The color filter CF may include various color filters such as a red color filter, a green color filter, and a blue color filter. However, the color filter CF may be omitted depending on the color of light emitted from the light emitting diode 120.

The planarization layer 114 is disposed on the passivation layer 113 and the color filter CF. The planarization layer 114 may planarize an upper portion of the substrate 110 including the driving transistor DT. The planarization layer 114 may be disposed in the entire display area AA and in a part of the non-display area NA. The planarization layer 114 may be made of an organic material. For example, the planarization layer 114 may be formed as a single layer or a multilayer of an acrylic-based organic material, but is not limited thereto.

In the display area AA, the light emitting diode 120 is disposed on the planarization layer 114. The light emitting diode 120 is a self-emitting element that emits light and may be disposed in each of the plurality of sub-pixels SP and driven by a plurality of driving transistors DT. The light emitting diode 120 includes an anode 121, an emission layer 122 and a cathode 123.

Meanwhile, the display device 100 may be configured by a top emission type or a bottom emission type depending on an emission direction of light emitted from the light emitting diode 120.

For the top emission type, light emitted from the light emitting diode 120 is emitted to an upper portion of the substrate 110. In the case of the top emission type, a reflective layer may be formed below the anode 121 to allow the light emitted from the light emitting diode 120 to travel to the upper portion of the substrate 110, e.g., toward the cathode 123.

For the bottom emission type, light emitted from the light emitting diode 120 is emitted to a lower portion of the substrate 110. In the case of the bottom emission type, the anode 121 may be made only of a transparent conductive material and the cathode 123 may be made of a metal material having a high reflectance to allow the light emitted from the light emitting diode 120 to travel to the lower portion of the substrate 110.

Hereinafter, for the convenience of description, the display device 100 according to an embodiment of the present disclosure will be assumed as a bottom emission type display device 100, but it is not limited thereto.

The anode 121 may supply holes to the emission layer 122 and may be made of a conductive material having a high work function. For example, the anode 121 may be made of tin oxide (TO), indium tin oxide (ITO), indium zinc oxide (IZO) or indium zinc tin oxide (ITZO), but is not limited thereto.

The bank 115 is disposed on the anode 121. The bank 115 is disposed to overlap with the entire display area AA and a part of the non-display area NA and cover an edge of the anode 121. The bank 115 is disposed at a boundary between the sub-pixels SP adjacent to each other to suppress mixing of colors of light emitted from the light emitting diodes 120 of the plurality of sub-pixels SP, respectively. The bank 115 may be made of an insulating material. For example, the bank 115 may be made of polyimide, acryl or a benzocyclobutene (BCB)-based resin, but it is not limited thereto.

The emission layer 122 is disposed on the anode 121 exposed from the bank 115. The emission layer 122 is supplied with the holes from the anode 121 and supplied with electrons from the cathode 123 to emit light. The emission layer 122 may be configured as a red emission layer, a green emission layer, a blue emission layer and a white emission layer depending on the color of light emitted from the emission layer 122.

The cathode 123 is disposed on the emission layer 122 and the bank 115. The cathode 123 may be disposed throughout the plurality of sub-pixels SP. That is, the light emitting diodes 120 of the plurality of sub-pixels SP may share the cathode 123. The cathode 123 may supply electrons to the emission layer 122 and may be made of a conductive material having a low work function. For example, the cathode 123 may be made of any one or more selected from the group consisting of metals such as magnesium (Mg), silver (Ag) and aluminum (Al), and an alloy thereof, but is not limited thereto. Further, since the display device 100 is of the bottom emission type, the cathode 123 may reflect the light emitted from the emission layer 122 toward the substrate 110.

Meanwhile, the cathode 123 may be further disposed not only in the display area AA, but also in a part of the non-display area NA. Thus, the cathode 123 may be electrically connected to a contact electrode and supplied with the low-potential power voltage VSS from the contact electrode.

Hereinafter, a plurality of contact electrodes will be described in more detail with reference to FIG. 3 through FIG. 5.

Figure 3:
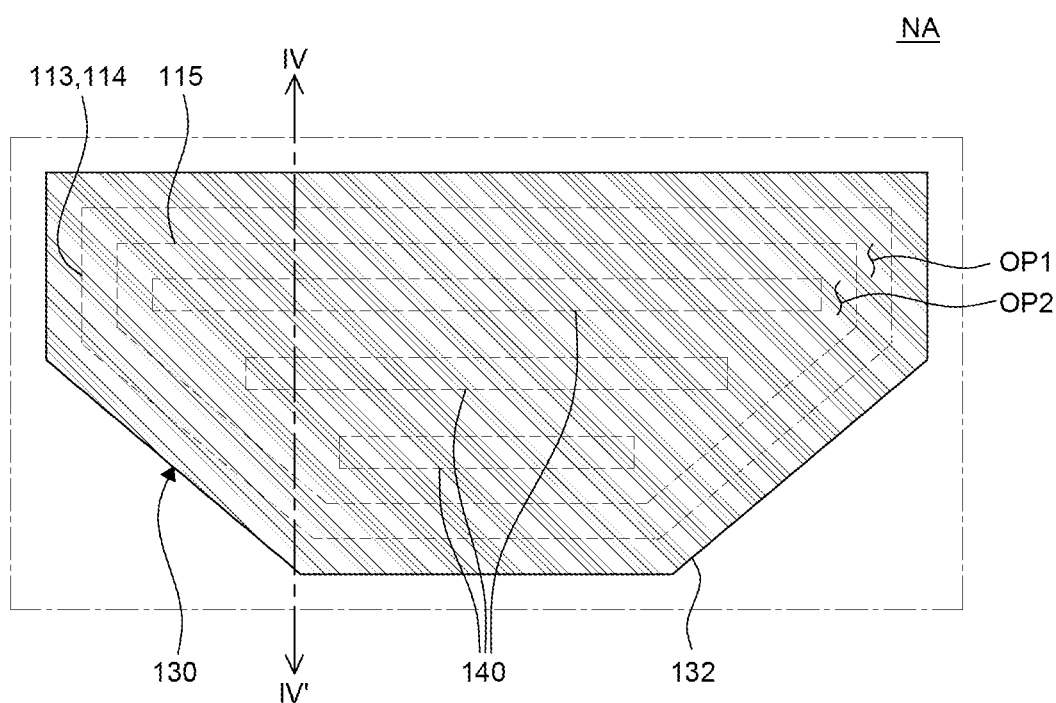
FIG. 3 is an enlarged plan view illustrating a contact electrode of the display device according to an embodiment of the present disclosure.

FIG. 3 is an enlarged plan view illustrating a contact electrode of the display device according to an embodiment of the present disclosure. FIG. 4 is a cross-sectional view as taken along a line IV-IV' of FIG. 3. FIG. 5 is an enlarged cross-sectional view illustrating a plurality of protrusions of the display device according to an embodiment of the present disclosure.

Figure 4:
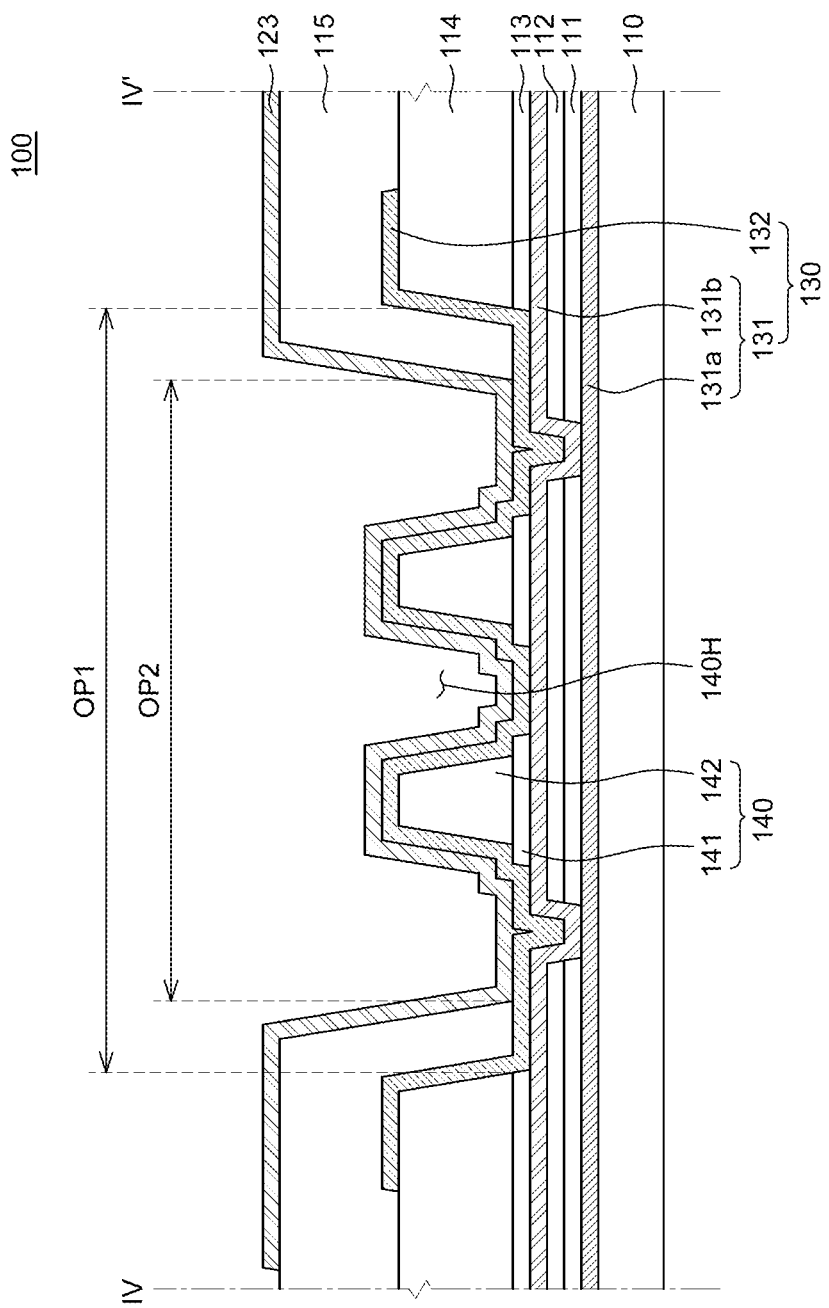
FIG. 4 is a cross-sectional view as taken along a line IV-IV' of FIG. 3.

Referring to FIG. 3 and FIG. 4, the contact electrode 130 is disposed in the non-display area NA. The contact electrode 130 includes a conductive layer 131 including a first conductive layer 131a and a second conductive layer 131b, and a transparent conductive layer 132.

First, the first conductive layer 131a of the conductive layer 131 is disposed on the substrate 110. The first conductive layer 131a may be made of the same material as any one of the components disposed in the display area AA. For example, the first conductive layer 131a may be made of the same material as the light shielding layer LS. However, the first conductive layer 131a of the contact electrode 130 may be made of the same material as any one of other components, such as a plurality of lines, a storage capacitor and the driving transistor DT, disposed in the display area AA besides the light shielding layer LS, but is not limited thereto.

The buffer layer 111 and the gate insulating layer 112 are disposed on the first conductive layer 131a. The buffer layer 111 and the gate insulating layer 112 include a contact hole through which the first conductive layer 131a of the contact electrode 130 is exposed. The first conductive layer 131a may be electrically connected to another component of the contact electrode 130 through the contact hole.

The second conductive layer 131b is disposed on the buffer layer 111 and the gate insulating layer 112. The second conductive layer 131b may be electrically connected to the first conductive layer 131a through the contact holes formed in the buffer layer 111 and the gate insulating layer 112. The second conductive layer 131b may be made of the same material as any one of the components disposed in the display area AA. For example, the second conductive layer 131b may be made of the same material as the gate electrode GE of the driving transistor DT. For example, the second conductive layer 131b may be made of copper (Cu), aluminum (Al), molybdenum (Mo), titanium (Ti) or an alloy thereof, but is not limited thereto.

In this case, at least any one of the first conductive layer 131a and the second conductive layer 131b may be extended to another part of the non-display area NA and may be supplied with the low-potential power voltage VSS. For example, a pad to which the low-potential power voltage VSS is supplied from the power supply unit PD may be disposed at an end portion of the non-display area NA. Also, at least any one of the first conductive layer 131a and the second conductive layer 131b may be extended toward the pad and may be electrically connected to the pad. Further, the first conductive layer 131a and the second conductive layer 131b may be supplied with the low-potential power voltage VSS from the power supply unit PD through the pad. However, the contact electrode 130 may be electrically connected to the power supply unit PD in different ways and is not limited thereto.

Meanwhile, the conductive layer 131 is made of the same material as the light shielding layer LS and the gate electrode GE made of copper (Cu), aluminum (Al), molybdenum (Mo), titanium (Ti) or an alloy thereof, as described above. Copper (Cu), aluminum (Al), molybdenum (Mo), titanium (Ti) or an alloy thereof has a low specific resistance, and, thus, a signal delay may be reduced. Therefore, the conductive layer 131 made of a material having a low specific resistance is connected to the power supply unit PD and supplied with the low-potential power voltage VSS. Accordingly, a transmission delay of the low-potential power voltage VSS may be reduced or minimized, and the low-potential power voltage VSS may be easily supplied to the display area AA.

The passivation layer 113 and the planarization layer 114 are disposed on the conductive layer 131. A first opening OP1 through which the second conductive layer 131b is exposed is formed in the passivation layer 113 and the planarization layer 114. Each of the passivation layer 113 and the planarization layer 114 may be extended from the display area AA toward the contact electrode 130 of the non-display area NA and may be integrated with each other. Also, the passivation layer 113 and the planarization layer 114 in the display area AA may be formed separately from the passivation layer 113 and the planarization layer 114 adjacent to the contact electrode 130.

The transparent conductive layer 132 may be disposed to cover the first opening OP1 formed in the passivation layer 113 and the planarization layer 114. The transparent conductive layer 132 may cover the second conductive layer 131b exposed through the first opening OP1 and may be electrically connected to the conductive layer 131. The transparent conductive layer 132 may be made of the same material as the anode 121 of the light emitting diode 120 among the components disposed in the display area AA. The transparent conductive layer 132 may be made of tin oxide (TO), indium tin oxide (ITO), indium zinc oxide (IZO) or indium zinc tin oxide (ITZO), but is not limited thereto.

The bank 115 is disposed on the transparent conductive layer 132, and the cathode 123 is disposed on the bank 115. The bank 115 includes a second opening OP2 through which the transparent conductive layer 132 of the contact electrode 130 is exposed. The bank 115 may be extended from the display area AA toward the contact electrode 130 and may be formed by the same process as the bank 115 in the display area AA, but may be formed to be spaced apart from the bank 115 in the display area AA.

The cathode 123 is disposed on the bank 115 and the second opening OP2. The cathode 123 may be extended from the display area AA toward the non-display area NA and may be disposed to cover the second opening OP2. The cathode 123 may be electrically connected to the transparent conductive layer 132 of the contact electrode 130 exposed through the second opening OP2. Therefore, the cathode 123 may be supplied with the low-potential power voltage VSS through the transparent conductive layer 132 and the conductive layer 131 of the contact electrode 130.

Meanwhile, there may be a problem of heat generation depending on a contact area between the cathode 123 and the contact electrode 130. Specifically, as the contact area between the cathode 123 and the contact electrode 130 decreases, resistance and a current density increase. Thus, a problem caused by heat generation is likely to occur. Also, some components of the display device 100 may be burnt due to heat generation, which may cause a defect in the display device 100. Accordingly, in the display device 100 according to an embodiment of the present disclosure, a plurality of protrusions 140 overlapping with the contact electrode 130 is disposed. Thus, the contact area between the contact electrode 130 and the cathode 123 may be increased.

Referring to FIG. 4, a plurality of insulating layers is disposed on the substrate 110. Also, at least one of the plurality of insulating layers includes the plurality of protrusions 140 disposed between the substrate 110 and the contact electrode 130 so as to overlap with the contact electrode 130. For example, the passivation layer 113 and the planarization layer 114 are disposed between the substrate 110 and the contact electrode 130. Also, the passivation layer 113 and the planarization layer 114 include the plurality of protrusions 140 overlapping with the contact electrode 130.

Specifically, the plurality of protrusions 140 is disposed between the second conductive layer 131b and the transparent conductive layer 132. The plurality of protrusions 140 includes a first layer 141 and a second layer 142. The first layer 141 may be made of the same material as the passivation layer 113. The second layer 142 may be made of the same material as the planarization layer 114. However, the plurality of protrusions 140 may also be formed as a single layer made of the same material as any one of the passivation layer 113 and the planarization layer 114, but is not limited thereto.

When the passivation layer 113 and the planarization layer 114 are formed on the display area AA and the non-display area NA, the plurality of protrusions 140 may be formed by leaving a part of the passivation layer 113 and the planarization layer 114 overlapping with the first opening OP1. The plurality of protrusions 140 may be formed by forming one or more holes 140H in the passivation layer 113 and the planarization layer 114 overlapping with the first opening OP1.

The transparent conductive layer 132 of the contact electrode 130 disposed to cover the plurality of protrusions 140 may have a shape corresponding to the shape of the plurality of protrusions 140. The transparent conductive layer 132 is formed along the surface of the plurality of protrusions. The transparent conductive layer 132 may be composed of a concave portion and a convex portion due to the plurality of protrusions 140. Since the transparent conductive layer 132 is composed of the convex portion covering the plurality of protrusions 140 and the concave portion between the plurality of protrusions 140, the surface area may be increased. Therefore, a contact area between the transparent conductive layer 132 and the cathode 123 in direct contact with the transparent conductive layer 132 of the contact electrode 130 may be increased.

Finally, the cathode 123 covering the transparent conductive layer 132 of the contact electrode 130 composed of the concave portion and the convex portion is also formed along the surface of the transparent conductive layer 132. If the plurality of protrusions 140 is not disposed, a contact surface between the contact electrode 130 and the cathode 123 may be extended straightly only. However, since the surface of the contact electrode 130 is composed of the concave portion and the convex portion due to the plurality of protrusions 140, the contact area between the contact electrode 130 and the cathode 123 may be increased. Also, the current density and resistance between the contact electrode 130 and the cathode 123 may be lowered, and, thus, heat generation may be reduced.

Figure 5:
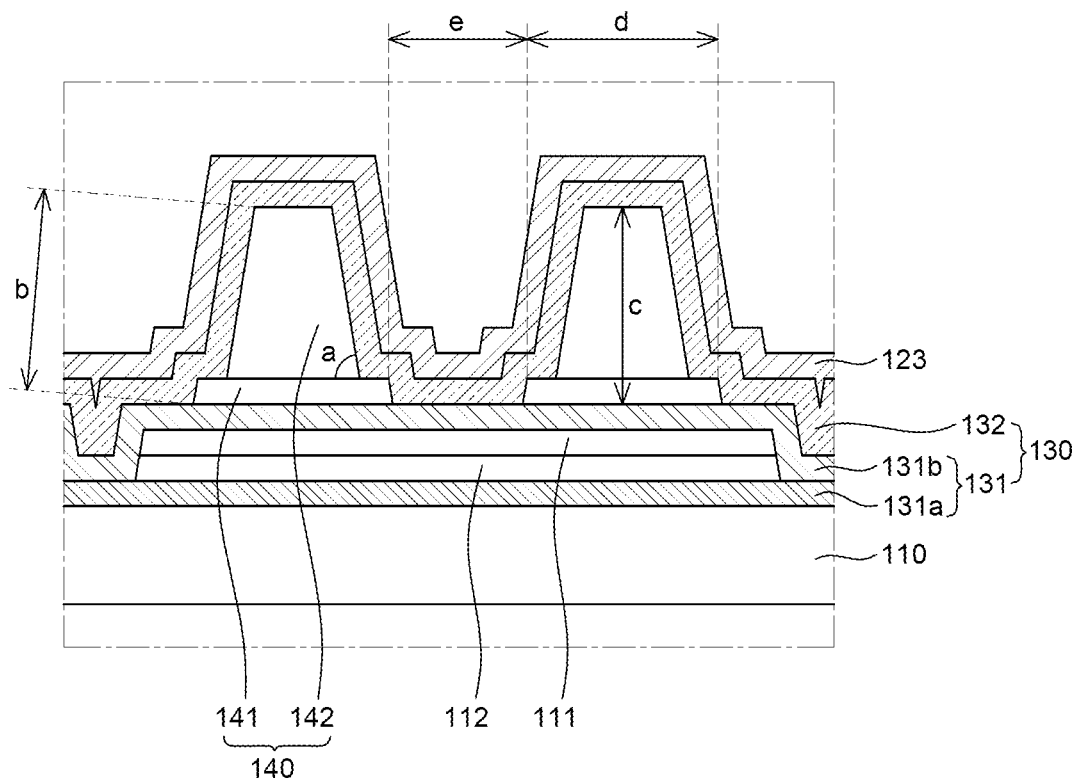
FIG. 5 is an enlarged cross-sectional view illustrating a plurality of protrusions of the display device according to an embodiment of the present disclosure.

Meanwhile, referring to FIG. 5, the contact area between the cathode 123 and the contact electrode 130 may vary depending on an angle a and a length b of a side surface of the plurality of protrusions 140, a thickness c and a width d of the plurality of protrusions 140 and a gap e between the plurality of protrusions 140.

First, the side surface of the plurality of protrusions 140 is an inclined surface. Also, the length b of the side surface of a protrusion 140 may vary depending on the angle a of the side surface of the protrusion 140. For example, as the angle a of the inclined side surface of the protrusion 140 decreases, the length b of the side surface, i.e., the area of the side surface, of the protrusion 140 may increase.

Further, as the thickness c of the plurality of protrusions 140 increases, the length b of the side surface of the protrusion 140 may increase. As the thickness c of the plurality of protrusions 140 increases, the length b and area of the side surface extended between an upper surface and a lower surface of the protrusion 140 may increase.

The number of the plurality of protrusions 140 disposed within the first opening OP1 may be increased by narrowing the between the plurality of protrusions 140. In this case, as the number of protrusions 140 increases, the concave portion and the convex portion on the surface of the contact electrode 130 may increase in number and the surface area of the contact electrode 130 may increase.

Further, the number of the plurality of protrusions 140 and the surface area of the contact electrode 130 may be increased by adjusting the width d of the plurality of protrusions 140. As the width d of the plurality of protrusions 140 decreases, the area of the upper and lower surfaces of the protrusion 140 may decrease and the number of the plurality of protrusions 140 disposed within the first opening OP1 may increase.

Therefore, the surface area of the contact electrode 130 and the contact area between the cathode 123 and the contact electrode 130 may be increased by controlling the angle a and the length b of the side surface of the plurality of protrusions 140, the thickness c and the width d of the plurality of protrusions 140 and the gap e between the plurality of protrusions 140. Also, the current density and resistance between the contact electrode 130 and the cathode 123 may be lowered, and, thus, heat generation may be reduced.

Therefore, in the display device 100 according to an embodiment of the present disclosure, the plurality of protrusions 140 overlapping with the contact electrode 130 is disposed. Thus, the contact area between the contact electrode 130 and the cathode 123 may be increased and the current density and resistance may be reduced so that heat generation may be reduced or minimized. The surface of the contact electrode 130 may be composed of the convex portion and the concave portion due to the plurality of protrusions 140 overlapping with the contact electrode 130. When the contact electrode 130 has an uneven surface due to the plurality of protrusions 140, the contact electrode 130 may have a greater surface area compared to a case where the contact electrode 130 has an even surface without the plurality of protrusions 140. In this case, the contact area between the contact electrode 130 and the cathode 123 increases. Thus, the current density and resistance between the contact electrode 130 and the cathode 123 may be decreased. Also, heat generation from the contact electrode 130 may be reduced or minimized due to the decreased resistance. Therefore, in the display device 100 according to an embodiment of the present disclosure, the plurality of protrusions 140 that causes an increase in surface area of the contact electrode 130 is formed. Thus, the contact area between the contact electrode 130 and the cathode 123 may be increased and heat generation may be reduced. Therefore, the reliability of the display device 100 may be improved.

Figure 6:
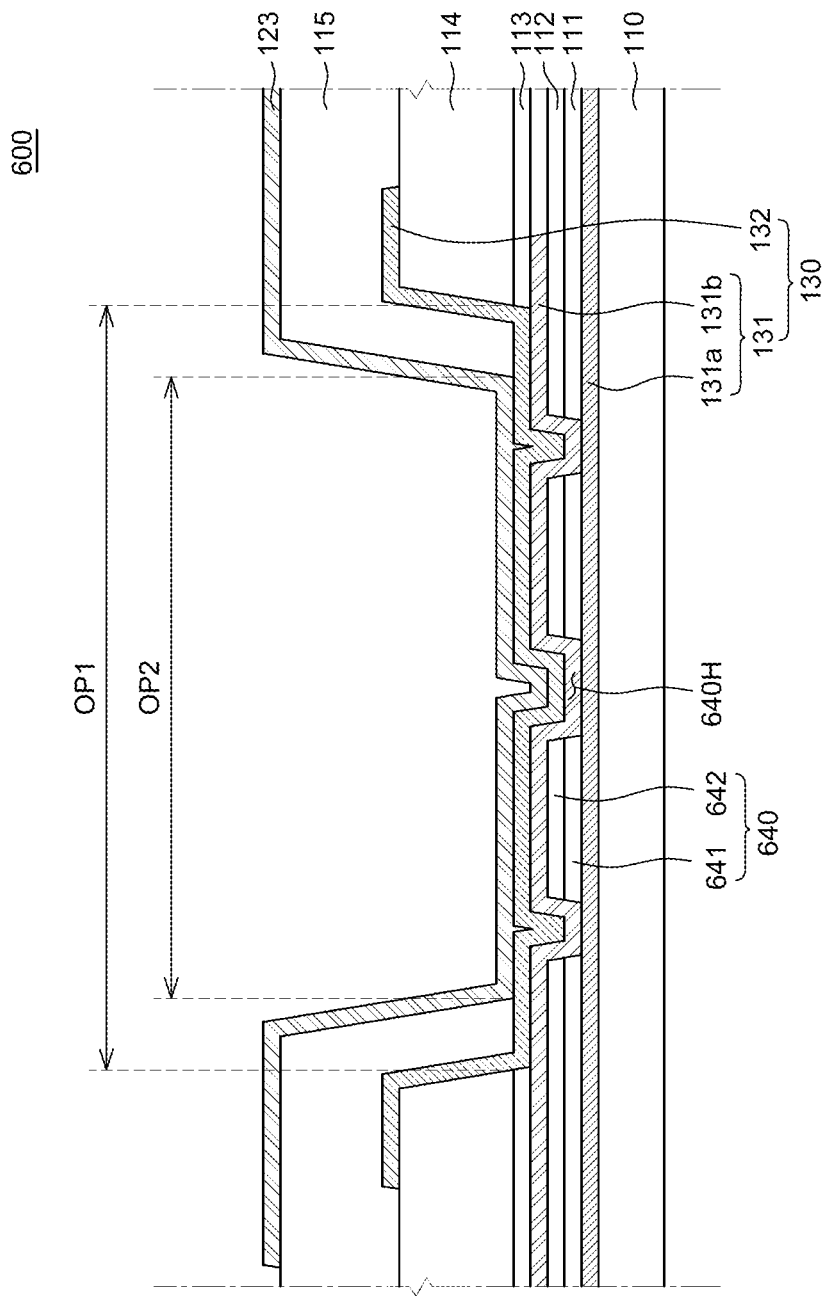
FIG. 6 is a cross-sectional view of a display device according to another embodiment of the present disclosure.

FIG. 6 is a cross-sectional view of a display device according to another embodiment of the present disclosure. A display device 600 shown in FIG. 6 is substantially the same as the display device 100 shown in FIG. 1 through FIG. 5 except a plurality of protrusions 640. Therefore, a redundant description thereof will be omitted.

Referring to FIG. 6, a plurality of insulating layers is disposed on the substrate 110. Also, at least one of the plurality of insulating layers includes the plurality of protrusions 640 disposed between the substrate 110 and the contact electrode 130 so as to overlap with the contact electrode 130. For example, the buffer layer 111 and the gate insulating layer 112 are disposed between the substrate 110 and the contact electrode 130. Also, the buffer layer 111 and the gate insulating layer 112 include the plurality of protrusions 640 overlapping with the contact electrode 130.

The plurality of protrusions 640 is disposed between the first conductive layer 131a and the second conductive layer 131b of the contact electrode 130. The plurality of protrusions 640 is disposed to overlap with the first opening OP1 and the second opening OP2 where the contact electrode 130 is formed.

The plurality of protrusions 640 includes a first layer 641 and a second layer 642. The first layer 641 may be made of the same material as the buffer layer 111, and the second layer 642 may be made of the same material as the gate insulating layer 112. For example, the first layer 641 and the second layer 642 of the plurality of protrusions 640 may be formed as a single layer or a multilayer of silicon oxide (SiOx) or silicon nitride (SiNx), but are not limited thereto.

The plurality of protrusions 640 may be formed by forming a plurality of holes 640H in a part of the buffer layer 111 and the gate insulating layer 112 overlapping with the first opening OP1 and the second opening OP2. For example, if the plurality of holes 640H is formed in the buffer layer 111 and the gate insulating layer 112 overlapping with the contact electrode 130, the buffer layer 111 and the gate insulating layer 112 not removed but remaining between the plurality of holes 640H may serve as the plurality of protrusions 640. Further, the plurality of holes 640H formed in a part of the buffer layer 111 and the gate insulating layer 112 may serve as contact holes electrically connecting the first conductive layer 131a and the second conductive layer 131b of the contact electrode 130.

The second conductive layer 131b of the contact electrode 130 may have a surface covering the plurality of protrusions 640 disposed within the first opening OP1 and corresponding to the shape of the plurality of protrusions 640. The plurality of protrusions 640 is disposed within the first opening OP1 so that the second conductive layer 131b is composed of a convex portion covering the plurality of protrusions 640 and a concave portion between the plurality of protrusions 640. Thus, the surface area of the second conductive layer 131b may be increased. If the plurality of protrusions 640 is not disposed within the first opening OP1, the second conductive layer 131b may be extended in a straight line flat along an upper surface of the first conductive layer 131a and the surface area may be decreased.

Further, the transparent conductive layer 132 formed on the second conductive layer 131b may also have a shape corresponding to the surface of the second conductive layer 131b. The transparent conductive layer 132 may also be composed of a convex portion overlapping with the plurality of protrusions 640 and a concave portion between the plurality of protrusions 640 due to the plurality of protrusions 640. Therefore, due to the plurality of protrusions 640, the surface areas of the second conductive layer 131b and the transparent conductive layer 132 of the contact electrode 130 may be increased.

Since the surface areas of the second conductive layer 131b and the transparent conductive layer 132 of the contact electrode 130 are increased due to the plurality of protrusions 640, the resistance or current density between the second conductive layer 131b and the transparent conductive layer 132 may be reduced. Also, due to the plurality of protrusions 640, the surface area of the transparent conductive layer 132 may be increased and the contact area between the contact electrode 130 and the cathode 123 may be increased.

Therefore, in the display device 600 according to another embodiment of the present disclosure, the plurality of protrusions 640 may be easily designed by using any one of the insulating layers adjacent to the contact electrode 130. The first conductive layer 131a, the second conductive layer 131b and the transparent conductive layer 132 of the contact electrode 130 made of the same material as various components in the display area AA may be formed with a plurality of insulating layers interposed. For example, the buffer layer 111 and the gate insulating layer 112 may be formed between the first conductive layer 131a and the second conductive layer 131b. Also, the passivation layer 113 and the planarization layer 114 may be formed between the second conductive layer 131b and the transparent conductive layer 132. In this case, an opening or a contact hole through which the first conductive layer 131a, the second conductive layer 131b and the transparent conductive layer 132 are exposed may be formed in at least a part of the plurality of insulating layers. Thus, the first conductive layer 131a, the second conductive layer 131b and the transparent conductive layer 132 may be electrically connected to each other. Further, when the opening and the contact hole are formed, the plurality of protrusions 640 may be easily formed by leaving a part of the insulating layer so as to overlap with the contact electrode 130. When the opening or contact hole is formed in the plurality of insulating layers, the plurality of protrusions 640 is formed. Accordingly, it is not necessary to perform a separate mask process for forming the plurality of protrusions 640. Therefore, in the display device 600 according to another embodiment of the present disclosure, the plurality of protrusions 640 may be easily formed at various positions by using the plurality of insulating layers adjacent to the contact electrode 130.

Figure 7:
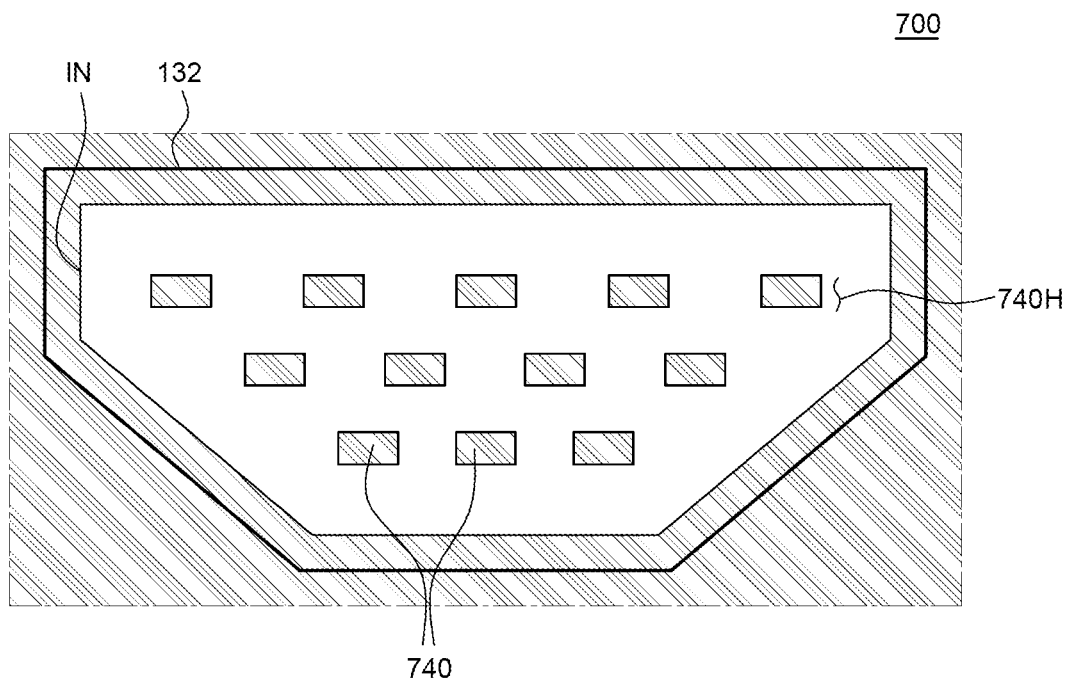
FIG. 7 and FIG. 8 are plan views illustrating a contact electrode of display devices according to various embodiments of the present disclosure.
Figure 8:
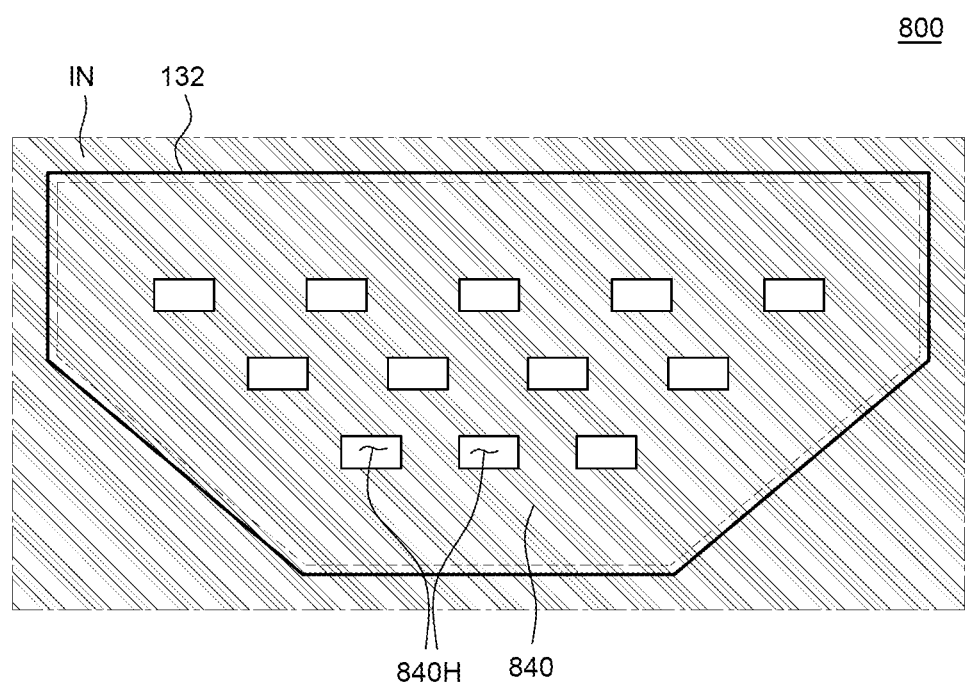

FIG. 7 and FIG. 8 are plan views illustrating a contact electrode of display devices according to various embodiments of the present disclosure. In FIG. 7 and FIG. 8, for the convenience of description, only the transparent conductive layer 132 of the contact electrode 130, a plurality of protrusions 740 and 840 and an insulating layer IN made of the same material as the plurality of protrusions 740 and 840 are illustrated. Further, FIG. 7 and FIG. 8 do not shows hatching of the transparent conductive layer 132, but show only hatching of the insulating layer IN and the plurality of protrusions 740 and 840.

Referring to FIG. 7 and FIG. 8, the contact electrode 130 including the first conductive layer 131a, the second conductive layer 131b and the transparent conductive layer 132 is disposed in the non-display area NA. Further, a plurality of insulating layers IN including the buffer layer 111, the gate insulating layer 112, the passivation layer 113 and the planarization layer 114 is disposed between each of the first conductive layer 131a, the second conductive layer 131b and the transparent conductive layer 132 of the contact electrode 130.

Further, the plurality of protrusions 740 and 840 overlapping with the contact electrode 130 may be formed by using at least one of the plurality of insulating layers IN. For example, the plurality of protrusions 740 and 840 formed from the buffer layer 111 and the gate insulating layer 112 or the plurality of protrusions 740 and 840 formed from the passivation layer 113 and the planarization layer 114 may be disposed to overlap with the contact electrode 130. In this case, the plurality of protrusions 740 and 840 may be formed into various shapes.

For example, referring to FIG. 7, the plurality of protrusions 740 is disposed to overlap with the contact electrode 130 and to be spaced apart from each other. The plurality of protrusions 740 may be separated from each other and formed into islands. In this case, holes 740H between the plurality of protrusions 740 may be connected to each other in a mesh form.

Referring to FIG. 8, the protrusions 840 overlapping with the contact electrode 130 and connected and integrated with each other is disposed. A plurality of holes 840H may be disposed inside the protrusions 840 connected and integrated with each other. The protrusions 840 may be connected to each other in a mesh form. The protrusions 840 may be a part of the insulating layer IN extended from the insulating layer IN toward the contact electrode 130. That is, the protrusions 840 and the insulating layer IN may be integrated with each other, and the holes 840H between the protrusions 840 may be separated from each other and formed into islands.

Meanwhile, FIG. 7 and FIG. 8 illustrate that the plurality of protrusions 740 and 840 and the plurality of holes 740H and 840H are rectangles when viewed from above. However, the plurality of protrusions 740 and 840 and the plurality of holes 740H and 840H may be circles or polygons when viewed from above, but are not limited thereto.

Therefore, in the display devices 700 and 800 according to various embodiments of the present disclosure, the plurality of protrusions 740 and 840 may be designed in various shapes. For example, referring to FIG. 7, the plurality of protrusions 740 disposed to overlap with the contact electrode 130 may be spaced apart from each other and formed into islands. Referring to FIG. 8, the plurality of protrusions 840 may be connected to each other in a mesh form. In this case, the plurality of holes 840H formed into islands spaced apart from each other between the protrusions 840. Therefore, the contact electrode 130 may have a convex portion due to the protrusions 840 in a mesh form, and the contact electrode 130 may have a concave portion due to the plurality of holes 840H. Accordingly, in the display devices 700 and 800 according to various embodiments of the present disclosure, the plurality of protrusions 740 and 840 can be designed in various shapes such islands, a mesh, circles or polygons.

The embodiments of the present disclosure can also be described as follows:

According to an aspect of the present disclosure, there is provided a display device. The display device includes a substrate including a display area and a non-display area adjacent to the display area, a plurality of light emitting diodes disposed in the display area and each including a cathode, a contact electrode disposed in the non-display area and supplying a low-potential power voltage to the cathode, and a plurality of insulating layers disposed on the substrate. At least one of the plurality of insulating layers includes a plurality of protrusions disposed to overlap with the contact electrode between the substrate and the contact electrode, and the contact electrode is composed of a convex portion overlapping with the plurality of protrusions and a concave portion between the plurality of protrusions.

The plurality of protrusions may be disposed to be spaced apart from each other.

The plurality of protrusions may be connected and integrated with each other, and a plurality of holes may be disposed between the plurality of protrusions integrated with each other.

The contact electrode may include a first conductive layer disposed on the substrate, a second conductive layer disposed on the first conductive layer, and a transparent conductive layer disposed on the second conductive layer and in contact with the cathode.

The plurality of insulating layers may include a buffer layer disposed between the first conductive layer and the second conductive layer, a gate insulating layer disposed between the buffer layer and the second conductive layer, a passivation layer disposed between the second conductive layer and the transparent conductive layer, and a planarization layer disposed between the passivation layer and the transparent conductive layer.

The plurality of protrusions may be disposed between the transparent conductive layer and the second conductive layer, and the transparent conductive layer may include the convex portion and the concave portion.

The passivation layer and the planarization layer among the plurality of insulating layers may include the plurality of protrusions, and the plurality of protrusions may include a first layer made of the same material as the passivation layer, and a second layer made of the same material as the planarization layer.

The plurality of protrusions may be disposed between the first conductive layer and the second conductive layer, and the second conductive layer and the transparent conductive layer may include the convex portion and the concave portion.

The buffer layer and the gate insulating layer among the plurality of insulating layers may include the plurality of protrusions, and the plurality of protrusions may include a first layer made of the same material as the buffer layer, and a second layer made of the same material as the gate insulating layer.

At least any one of the buffer layer, the gate insulating layer, the passivation layer and the planarization layer may include the plurality of protrusions.

The display device may further include a light shielding layer disposed on the substrate in the display area, and a transistor disposed on the light shielding layer and including a gate electrode, a source electrode and a drain electrode. The first conductive layer may be made of the same material as the light shielding layer, and the second conductive layer may be made of the same material as any one of the gate electrode, the source electrode and the drain electrode.

Each of the plurality of light emitting diodes may further include an anode between the substrate and the cathode, and the transparent conductive layer may be made of the same material as the anode.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. All the technical concepts and the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a substrate including a display area and a non-display area adjacent to the display area;
a plurality of light emitting diodes disposed in the display area and each including a cathode;
a contact electrode disposed in the non-display area and supplying a low-potential power voltage to the cathode; and
a plurality of insulating layers disposed on the substrate,
wherein at least one of the plurality of insulating layers includes a plurality of protrusions disposed to overlap with the contact electrode between the substrate and the contact electrode, and
wherein the contact electrode is composed of a convex portion overlapping with the plurality of protrusions and a concave portion between the plurality of protrusions, wherein the contact electrode includes:
a first conductive layer disposed on the substrate;
a second conductive layer disposed on the first conductive layer; and
a transparent conductive layer disposed on the second conductive layer and in contact with the cathode,
wherein the plurality of insulating layers includes:
a buffer layer disposed between the first conductive layer and the second conductive layer;
a gate insulating layer disposed between the buffer layer and the second conductive layer;
a passivation layer disposed between the second conductive layer and the transparent conductive layer; and
a planarization layer disposed between the passivation layer and the transparent conductive layer.

2. The display device according to claim 1, wherein the plurality of protrusions is disposed to be spaced apart from each other.

3. The display device according to claim 1, wherein the plurality of protrusions is connected and integrated with each other, and
a plurality of holes is disposed between the plurality of protrusions integrated with each other.

4. The display device according to claim 1, wherein the plurality of protrusions is disposed between the transparent conductive layer and the second conductive layer, and
wherein the transparent conductive layer includes the convex portion and the concave portion.

5. The display device according to claim 4, wherein the passivation layer and the planarization layer among the plurality of insulating layers include the plurality of protrusions, and
the plurality of protrusions includes:
a first layer made of the same material as the passivation layer; and
a second layer made of the same material as the planarization layer.

6. The display device according to claim 1, wherein the plurality of protrusions is disposed between the first conductive layer and the second conductive layer, and
wherein the second conductive layer and the transparent conductive layer include the convex portion and the concave portion.

7. The display device according to claim 6, wherein the buffer layer and the gate insulating layer among the plurality of insulating layers include the plurality of protrusions, and
the plurality of protrusions includes:
a first layer made of the same material as the buffer layer; and
a second layer made of the same material as the gate insulating layer.

8. The display device according to claim 1, wherein at least any one of the buffer layer, the gate insulating layer, the passivation layer, and the planarization layer includes the plurality of protrusions.

9. The display device according to claim 1, further comprising:
a light shielding layer disposed on the substrate in the display area; and
a transistor disposed on the light shielding layer and including a gate electrode, a source electrode, and a drain electrode,
wherein the first conductive layer is made of a same material as the light shielding layer, and
wherein the second conductive layer is made of a same material as any one of the gate electrode, the source electrode, and the drain electrode.

10. The display device according to claim 1, wherein each of the plurality of light emitting diodes further includes an anode between the substrate and the cathode, and
wherein the transparent conductive layer is made of a same material as the anode.

* * * * *